United States Patent
White et al.

(10) Patent No.: US 11,164,738 B2
(45) Date of Patent: Nov. 2, 2021

(54) COMPOSITIONS AND METHODS FOR REMOVING CERIA PARTICLES FROM A SURFACE

(71) Applicant: Entegris, Inc., Billerica, MA (US)

(72) Inventors: Daniela White, Ridgefield, CT (US); Thomas Parson, Billerica, MA (US); Michael White, Billerica, MA (US); Emanuel I. Cooper, Scarsdale, NY (US); Atanu Das, Danbury, CT (US)

(73) Assignee: Entegris, Inc., Billerica, MA (US)

( * ) Notice: Subject to any disclaimer, the term of this patent is extended or adjusted under 35 U.S.C. 154(b) by 0 days.

(21) Appl. No.: 15/874,388

(22) Filed: Jan. 18, 2018

(65) Prior Publication Data

US 2018/0204736 A1    Jul. 19, 2018

Related U.S. Application Data

(60) Provisional application No. 62/447,729, filed on Jan. 18, 2017.

(51) Int. Cl.
| | | |
|---|---|---|
| *C09G 1/04* | (2006.01) | |
| *H01L 21/02* | (2006.01) | |
| *H01L 21/321* | (2006.01) | |
| *C08L 33/08* | (2006.01) | |
| *C08L 33/10* | (2006.01) | |
| *C09G 1/16* | (2006.01) | |

(52) U.S. Cl.
CPC ........ *H01L 21/02065* (2013.01); *C08L 33/08* (2013.01); *C08L 33/10* (2013.01); *C09G 1/04* (2013.01); *C09G 1/16* (2013.01); *H01L 21/3212* (2013.01); *C08L 2201/54* (2013.01)

(58) Field of Classification Search
None
See application file for complete search history.

(56) References Cited

U.S. PATENT DOCUMENTS

| | | | | |
|---|---|---|---|---|
| 6,607,424 B1* | 8/2003 | Costas | ..................... | C09G 1/02 |
| | | | | 257/E21.304 |
| 8,754,021 B2* | 6/2014 | Barnes | ................... | C11D 3/044 |
| | | | | 134/1.3 |
| 2003/0089891 A1* | 5/2003 | Andreas | .............. | H01L 21/3212 |
| | | | | 252/500 |
| 2006/0027252 A1* | 2/2006 | Mun | ........................ | B08B 3/08 |
| | | | | 134/28 |
| 2007/0190770 A1* | 8/2007 | Kurashima | .............. | C11D 1/22 |
| | | | | 438/597 |
| 2009/0133716 A1* | 5/2009 | Lee | ................... | H01L 21/02063 |
| | | | | 134/3 |
| 2009/0312219 A1* | 12/2009 | Tamura | ................ | C11D 3/3765 |
| | | | | 510/245 |
| 2010/0163788 A1* | 7/2010 | Visintin | ................... | C11D 1/62 |
| | | | | 252/79.3 |
| 2011/0237071 A1* | 9/2011 | Yamada | ........... | H01L 21/02063 |
| | | | | 438/653 |
| 2011/0245127 A1* | 10/2011 | Suzuki | .................... | C11D 1/008 |
| | | | | 510/163 |
| 2013/0053291 A1* | 2/2013 | Otake | ..................... | C11D 3/361 |
| | | | | 510/175 |
| 2013/0143785 A1* | 6/2013 | Taniguchi | ............ | C11D 7/3209 |
| | | | | 510/175 |
| 2013/0203643 A1* | 8/2013 | Nakanishi | ............ | C11D 3/0042 |
| | | | | 510/175 |
| 2013/0244432 A1 | 9/2013 | Reiss et al. | | |
| 2014/0011359 A1* | 1/2014 | Klipp | ....................... | C11D 1/72 |
| | | | | 438/692 |
| 2014/0128307 A1 | 5/2014 | Chhabra | | |
| 2014/0264151 A1* | 9/2014 | Ko | ........................... | C23G 1/20 |
| | | | | 252/79.1 |
| 2014/0318584 A1* | 10/2014 | Cooper | ............. | H01L 21/02057 |
| | | | | 134/42 |
| 2015/0018261 A1* | 1/2015 | Li | ........................... | C11D 1/722 |
| | | | | 510/175 |
| 2015/0094248 A1* | 4/2015 | Rath | ........................ | G03F 7/423 |
| | | | | 510/175 |
| 2016/0122696 A1* | 5/2016 | Liu | ....................... | C11D 3/0042 |
| | | | | 257/798 |
| 2018/0166273 A1* | 6/2018 | Huang | .............. | H01L 21/02074 |

FOREIGN PATENT DOCUMENTS

| | | |
|---|---|---|
| CN | 105308164 A | 2/2016 |
| JP | 2002069495 A | 3/2002 |
| JP | 2010163608 A | 7/2010 |
| JP | 2016519423 A | 6/2016 |
| TW | 201542811 A | 11/2015 |
| WO | 2014/186538 A1 | 11/2014 |
| WO | 2015/095175 A1 | 6/2015 |
| WO | 2015/119925 A1 | 8/2015 |

* cited by examiner

*Primary Examiner* — Shamim Ahmed

(57) ABSTRACT

A removal composition and process for cleaning post-chemical mechanical polishing (CMP) contaminants and ceria particles from a microelectronic device having said particles and contaminants thereon. The composition achieves highly efficacious removal of the ceria particles and CMP contaminant material from the surface of the microelectronic device without compromising the low-k dielectric, silicon nitride, or tungsten-containing materials.

12 Claims, No Drawings

COMPOSITIONS AND METHODS FOR REMOVING CERIA PARTICLES FROM A SURFACE

RELATED APPLICATIONS

This application claims the benefit of U.S. Provisional Application No. 62/447,729 filed on Jan. 18, 2017, the entire disclosure of which is incorporated in its entirety by reference herein.

FIELD

The present invention relates generally to compositions for removing ceria particles and other chemical mechanical polishing slurry contaminants from microelectronic devices having same thereon.

DESCRIPTION OF THE RELATED ART

Microelectronic device wafers are used to form integrated circuits. The microelectronic device wafer includes a substrate, such as silicon, into which regions are patterned for deposition of different materials having insulative, conductive or semi-conductive properties.

In order to obtain the correct patterning, excess material used in forming the layers on the substrate must be removed. Further, to fabricate functional and reliable circuitry, it is important to prepare a flat or planar microelectronic wafer surface prior to subsequent processing. Thus, it is necessary to remove and/or polish certain surfaces of a microelectronic device wafer.

Chemical Mechanical Polishing or Planarization ("CMP") is a process in which material is removed from a surface of a microelectronic device wafer, and the surface is polished (e.g., planarized) by coupling a physical process such as abrasion with a chemical process such as oxidation or chelation. In its most rudimentary form, CMP involves applying an abrasive slurry having an active chemistry to a polishing pad that buffs the surface of a microelectronic device wafer during the removal, planarization, and polishing processes. Removal or polishing processes using purely physical or purely chemical action are not as effective as the synergistic combination of both in order to achieve fast, uniform removal. In addition, in the fabrication of integrated circuits, the CMP slurry should also be able to preferentially remove films that comprise complex layers of metals and other materials so that highly planar surfaces can be produced for subsequent photolithography, or patterning, etching and thin-film processing.

In a front-end-of-the-line (FEOL) method for forming an isolation region in a silicon substrate using the shallow trench isolation (STI) process, a pad oxide film and a pad nitride film are deposited on a semiconductor substrate and patterned to expose portions of the substrate, which correspond to an isolation region. Then, the exposed regions of the substrate are etched to form a trench. Thereafter, the substrate is subjected to a sacrificial oxidation process to remove damage caused by the substrate etching followed by formation of a wall oxide film on the surface of the trench. Next, a trench-buried oxide film (e.g., an oxide film formed by high density plasma chemical vapor deposition referred to as an HDP-oxide film), is deposited on the surface of the substrate in such a manner as to be buried in the trench. Then, the surface of the HDP-oxide film is subjected to chemical mechanical polishing until the pad nitride film is exposed. The resulting substrate is then cleaned and the pad nitride film which was used as an etch barrier during the trench etch is removed, completing the formation of an isolation region.

A CMP slurry using ceria particles achieves a faster polishing speed for an insulator, relative to a silica-containing slurry. Moreover, a ceria-based slurry is most often used because of the ability to achieve STI pattern planarization with minimal oxide erosion. Disadvantageously, ceria-based slurries are difficult to remove from STI structures because of the oppositely charged zeta potentials of the ceria particles relative to the silicon oxide and silicon nitride surfaces. If a device is manufactured with these residues remaining on the wafer, the residues will lead to short circuits and an increase in electric resistance. Ceria particles are also a problem with FinFET structures following CMP processing using ceria slurries.

Currently the most efficient wet cleaning formulation for removing ceria particles is dilute hydrofluoric acid (DHF). However, DHF disadvantageously etches silicon oxide and other low-k dielectric materials.

Therefore, a need remains for a ceria particle removal composition and process that effectively removes ceria particles from a surface of a microelectronic device while not damaging the underlying materials such as silicon nitride, low-k dielectrics (e.g., silicon oxide), and tungsten-containing layers. The ceria particle removal composition should also efficaciously remove CMP slurry contaminants from the surface of the microelectronic device.

SUMMARY

The present invention generally relates to a removal composition and process, particularly useful for cleaning ceria particles and CMP contaminants from microelectronic devices having said particles and CMP contaminants thereon.

In one aspect, an aqueous removal composition is described, said composition comprising at least one pH adjusting agent, at least one reducing agent, at least one organic additive, water, optionally at least one complexing agent, and optionally at least one oxygen scavenger.

In another aspect, a method of removing ceria particles and CMP contaminants from a microelectronic device having said particles and contaminants thereon is described, said method comprising contacting the microelectronic device with a removal composition for sufficient time to at least partially clean said particles and contaminants from the microelectronic device, wherein said removal composition comprises at least one pH adjusting agent, at least one reducing agent, at least one organic additive, water, optionally at least one complexing agent, and optionally at least one oxygen scavenger.

In still another aspect, an article of manufacture is described, said article comprising an aqueous removal composition, a microelectronic device wafer, and material selected from the group consisting of ceria particles, CMP contaminants and combinations thereof, wherein the cleaning composition comprises at least one pH adjusting agent, at least one reducing agent, at least one organic additive, water, optionally at least one complexing agent, and optionally at least one oxygen scavenger.

Other aspects, features and advantages will be more fully apparent from the ensuing disclosure and appended claims.

DETAILED DESCRIPTION, AND PREFERRED EMBODIMENTS THEREOF

The present invention relates generally to compositions useful for the removal of ceria particles and CMP contaminants from a microelectronic device having such material(s) thereon. Advantageously, the ceria particles and CMP contaminants are efficaciously removed using the compositions and further the compositions are compatible with silicon nitride and low-k dielectric (e.g., silicon oxide) layers.

For ease of reference, "microelectronic device" corresponds to semiconductor substrates, flat panel displays, phase change memory devices, solar panels and other products including solar substrates, photovoltaics, and microelectromechanical systems (MEMS), manufactured for use in microelectronic, integrated circuit, or computer chip applications. Solar substrates include, but are not limited to, silicon, amorphous silicon, polycrystalline silicon, monocrystalline silicon, CdTe, copper indium selenide, copper indium sulfide, and gallium arsenide on gallium. The solar substrates may be doped or undoped. It is to be understood that the term "microelectronic device" is not meant to be limiting in any way and includes any substrate that will eventually become a microelectronic device or microelectronic assembly.

As used herein, "ceria particles" corresponds to cerium-based abrasive particles that may be used in chemical mechanical polishing slurries, including, for example, a cerium oxide having the formula $Ce_2O_3$ and $CeO_2$. It should be appreciated that the "ceria particles" may comprise, consist of, or consist essentially of cerium oxide.

As used herein, "contaminants" correspond to chemicals present in the CMP slurry, reaction by-products of the polishing slurry, post-CMP residue, chemicals present in the wet etching composition, reaction by products of the wet etching composition, and any other materials that are the by-products of the CMP process, the wet etching, the plasma etching or the plasma ashing process.

As used herein, "post-CMP residue" corresponds to particles from the polishing slurry, e.g., chemicals present in the slurry, reaction by-products of the polishing slurry, carbon-rich particles, polishing pad particles, brush deloading particles, equipment materials of construction particles, metal, organic residues, and any other materials that are the by-products of the CMP process. In addition, if tungsten was removed during the CMP process, the post-CMP residue can further comprise tungsten-containing particles.

As defined herein, "low-k dielectric material" corresponds to any material used as a dielectric material in a layered microelectronic device, wherein the material has a dielectric constant less than about 3.5. Preferably, the low-k dielectric materials include low-polarity materials such as silicon-containing organic polymers, silicon-containing hybrid organic/inorganic materials, organosilicate glass (OSG), TEOS, fluorinated silicate glass (FSG), silicon dioxide, and carbon-doped oxide (CDO) glass. It is to be appreciated that the low-k dielectric materials may have varying densities and varying porosities.

As defined herein, "complexing agent" includes those compounds that are understood by one skilled in the art to be complexing agents, chelating agents and/or sequestering agents. Complexing agents will chemically combine with or physically hold the metal atom and/or metal ion to be removed using the compositions described herein.

"Substantially devoid" is defined herein as less than 2 wt. %, preferably less than 1 wt. %, more preferably less than 0.5 wt. %, and most preferably less than 0.1 wt. %. "Devoid" is intended to correspond to less than 0.001 wt % to account for environmental contamination.

As used herein, "about" is intended to correspond to ±5% of the stated value.

As used herein, "oxidizing agents" correspond to compounds that oxidize exposed metal(s) resulting in corrosion of the metal or oxide formation on the metal. Oxidizing agents include, but are not limited to: hydrogen peroxide; other percompounds such as salts and acids containing peroxomonosulfate, perborate, perchlorate, periodate, persulfate, permanganate, and peracetate anions; and amine-N-oxides.

As used herein, "fluoride containing compounds" correspond to salts or acid compounds comprising a fluoride ion ($F^-$) that is ionically bonded to another atom.

As defined herein, the term "barrier material" corresponds to any material used in the art to seal the metal lines (e.g., copper interconnects) to minimize the diffusion of said metal (e.g., copper) into the dielectric material. Preferred barrier layer materials include tantalum, titanium, ruthenium, hafnium, tungsten, and other refractory metals and their nitrides and silicides.

For the purposes of this disclosure, "degradation products of adenosine and adenosine derivatives" includes, but is not limited to, adenine ($C_5H_5N_5$), methylated adenine (e.g., N-methyl-7H-purin-6-amine, $C_6H_7N_5$), dimethylated adenine (e.g., N,N-dimethyl-7H-purin-6-amine, $C_7H_9N_5$), N4,N4-dimethylpyrimidine-4,5,6-triamine ($C_6H_{11}N_5$), 4,5,6-triaminopyrimidine, allantoin ($C_4H_6N_4O_3$), hydroxylated C—O—O—C dimers (($C_5H_4N_5O_2)_2$), C—C bridged dimers (($C_5H_4N_5)_2$ or ($C_5H_4N_5O)_2$), ribose ($C_5H_{10}O_5$), methylated ribose (e.g., 5-(methoxymethyl)tetrahydrofuran-2,3,4-triol, $C_6H_{12}O_5$), tetramethylated ribose (e.g., 2,3,4-trimethoxy-5-(methoxymethyl)tetrahydrofuran, $C_9H_{18}O_5$), and other ribose derivatives such as methylated hydrolyzed diribose compounds.

As used herein, "surfactants" correspond to amphiphilic species having hydrophobic groups and hydrophilic groups, as readily understood by those skilled in the art, but do not include polymers. As defined herein, "polymers" correspond to species that have repeating monomeric groups, and can be natural or synthetic. It should be appreciated that a "polymer" can be a homopolymer, having only one type of repeating monomer, or a co-polymer, having more than one type of repeating monomer.

As used herein, "suitability" for removing ceria particles and CMP contaminants from a microelectronic device having said particles and contaminants thereon corresponds to at least partial removal of said particles/contaminants from the microelectronic device. Cleaning efficacy is rated by the reduction of objects on the microelectronic device. For example, pre- and post-cleaning analysis may be carried out using an atomic force microscope. The particles on the sample may be registered as a range of pixels. A histogram (e.g., a Sigma Scan Pro) may be applied to filter the pixels in a certain intensity (e.g., 231-235) and the number of particles counted. The particle reduction may be calculated using:

$$\text{Cleaning Efficacy} = \frac{(\text{Number of PreClean Objects} - \text{Number of PostClean Objects})}{\text{Number of PreClean Objects}} \times 100$$

Notably, the method of determination of cleaning efficacy is provided for example only and is not intended to be limited to same. Alternatively, the cleaning efficacy may be considered as a percentage of the total surface that is covered by particulate matter. For example, AFM's may be programmed to perform a z-plane scan to identify topographic areas of interest above a certain height threshold and then calculate the area of the total surface covered by said areas of interest. One skilled in the art would readily understand that the less area covered by said areas of interest post-cleaning, the more efficacious the removal composition. Preferably, at least 75% of the particles/contaminants are removed from the microelectronic device using the compositions described herein, more preferably at least 90%, even more preferably at least 95%, and most preferably at least 99% of the particles/contaminants are removed.

Compositions described herein may be embodied in a wide variety of specific formulations, as hereinafter more fully described.

In all such compositions, wherein specific components of the composition are discussed in reference to weight percentage ranges including a zero lower limit, it will be understood that such components may be present or absent in various specific embodiments of the composition, and that in instances where such components are present, they may be present at concentrations as low as 0.00001 weight percent, based on the total weight of the composition in which such components are employed.

In a first aspect, a removal composition is described, which, in some embodiments, is preferably an aqueous removal composition, comprising, consisting of, or consisting essentially of at least one pH adjusting agent, at least one reducing agent, at least one organic additive, optionally at least one complexing agent, optionally at least one polymer, and optionally at least one oxygen scavenger. In an embodiment of the first aspect, the removal composition comprises, consists of, or consists essentially of at least one pH adjusting agent, at least one reducing agent, and at least one organic additive. In another embodiment of the first aspect, the removal composition comprises, consists of, or consists essentially of at least one pH adjusting agent, at least one reducing agent, at least one organic additive, and at least one complexing agent. In yet another embodiment of the first aspect, the removal composition comprises, consists of, or consists essentially of at least one pH adjusting agent, at least one reducing agent, at least one organic additive, and at least one polymer. In still another embodiment of the first aspect, the removal composition comprises, consists of, or consists essentially of at least one pH adjusting agent, at least one reducing agent, at least one organic additive, and at least one oxygen scavenger. In another embodiment of the first aspect, the removal composition comprises, consists of, or consists essentially of at least one pH adjusting agent, at least one reducing agent, at least one organic additive, at least one complexing agent, and at least one oxygen scavenger. In still another embodiment of the first aspect, the removal composition comprises, consists of, or consists essentially of at least one pH adjusting agent, at least one reducing agent, at least one organic additive, at least one complexing agent, and at least one polymer. In yet another embodiment of the first aspect, the removal composition comprises, consists of, or consists essentially of at least one pH adjusting agent, at least one reducing agent, at least one organic additive, at least one polymer, and at least one oxygen scavenger. In another embodiment of the first aspect, the removal composition comprises, consists of, or consists essentially of at least one pH adjusting agent, at least one reducing agent, at least one organic additive, at least one complexing agent, at least one polymer, and at least one oxygen scavenger. It is understood by those skilled in the art that the aqueous cleaning compositions described herein further comprise water, preferably deionized water.

In each embodiment, the removal composition can be substantially devoid of at least one of oxidizing agents; fluoride-containing sources; surfactants; tetramethylammonium hydroxide; chemical mechanical polishing abrasive materials (e.g., silica, alumina, etc.); and corrosion inhibitors selected from the group consisting of cyanuric acid, barbituric acid and derivatives thereof, glucuronic acid, squaric acid, alpha-keto acids, adenosine and derivatives thereof, ribosylpurines and derivatives thereof, purine compounds and derivatives thereof, degradation products of adenosine and adenosine derivatives, triaminopyrimidine and other substituted pyrimidines, purine-saccharide complexes, phosphonic acid and derivatives thereof, phenanthroline, glycine, nicotinamide and derivatives thereof, flavonoids such as flavonols and anthocyanins and derivatives thereof, quercitin and derivatives thereof, and combinations thereof, prior to removal of residue material from the microelectronic device. In addition, the removal compositions should not solidify to form a polymeric solid, including, for example, a photoresist.

Complexing agents, when present, include species having the general formula $NR^1R^2R^3$, wherein $R^1$, $R^2$ and $R^3$ may be the same as or different from one another and are selected from the group consisting of hydrogen, straight-chain or branched $C_1$-$C_6$ alkyl (e.g., methyl, ethyl, propyl, butyl, pentyl, and hexyl) groups, straight-chain or branched $C_1$-$C_6$ hydroxyalkyl (e.g., hydroxymethyl, hydroxyethyl, hydroxypropyl, hydroxybutyl, hydroxypentyl, and hydroxyhexyl) groups, and $C_1$-$C_6$ alkyl ethers of straight chain or branched $C_1$-$C_6$ hydroxyalkyl groups as defined above. Most preferably, at least one of $R^1$, $R^2$ and $R^3$ is a straight-chain or branched $C_1$-$C_6$ hydroxyalkyl group. Examples include, without limitation, alkanolamines such as aminoethylethanolamine, N-methylaminoethanol, aminoethoxyethanol, dimethylaminoethoxyethanol, diethanolamine, N-methyldiethanolamine, monoethanolamine (MEA), triethanolamine (TEA), 1-amino-2-propanol, 2-amino-1-butanol, isobutanolamine, triethylenediamine, other $C_1$-$C_8$ alkanolamines and combinations thereof. When the amine includes the alkylether component, the amine may be considered an alkoxyamine, e.g., 1-methoxy-2-aminoethane. Alternatively, or in addition to the $NR^1R^2R^3$ amine, the complexing agent may be a multi-functional amine including, but not limited to, 4-(2-hydroxyethyl)morpholine (HEM), 1,2-cyclohexanediamine-N,N,N',N'-tetraacetic acid (CDTA), ethylenediaminetetraacetic acid (EDTA), m-xylenediamine (MXDA), iminodiacetic acid (IDA), 2-(hydroxyethyl)iminodiacetic acid (HIDA), nitrilotriacetic acid, thiourea, 1,1,3,3-tetramethylurea, urea, urea derivatives, uric acid, alanine, arginine, asparagine, aspartic acid, cysteine, glutamic acid, glutamine, histidine, isoleucine, leucine, lysine, methionine, phenylalanine, proline, serine, threonine, tryptophan, tyrosine, valine, and combinations thereof. Alternatively, or in addition to the aforementioned complexing agents, additional complexing agents can include phosphonates (e.g., 1-hydroxyethylidene-1,1-diphosphonic acid (HEDP), 1,5,9-triazacyclododecane-N,N',N"-tris(methylenephosphonic acid) (DOTRP), 1,4,7,10-tetraazacyclododecane-N,N',N",N'"-tetrakis(methylenephosphonic acid) (DOTP), nitrilotris(methylene)triphosphonic acid, diethylenetriaminepentakis(methylenephosphonic acid) (DETAP), aminotri(methylenephosphonic acid), bis(hexamethylene)triamine pentamethylene phosphonic acid, 1,4,7-triazacyclononane-N,N',N"-tris(methylenephosphonic acid (NOTP), hydroxyethyldiphosphonate, nitrilotris(methylene)phosphonic acid, 2-phosphono-butane-1,2,3,4-tetracarboxylic, carboxy ethyl phosphonic acid, aminoethyl phosphonic acid, glyphosate, ethylene diamine tetra(methylenephosphonic acid) phenylphosphonic acid, salts thereof, and derivatives thereof) and/or carboxylic acids (e.g., oxalic acid, succinnic acid, maleic acid, malic acid, malonic acid, adipic acid, phthalic acid, citric acid, sodium citrate, potassium citrate, ammonium citrate, tricarballylic acid, trimethylolpropionic acid, tartaric acid, glucuronic acid, 2-carboxypyridine) and/or sulfonic acids such as tiron (4,5-Dihydroxy-1,3-benzenedisulfonic acid disodium salt). Preferably, the at least one complexing agent comprises a species selected from the group consisting of monoethanolamine, triethanolamine, sulfuric acid, citric acid and combinations thereof. When present, the amount of complexing agent(s) in the removal composition is in a range from about 0.01 wt % to about 10 wt %, based on the total weight of the removal composition.

pH adjusting agents include acids and/or bases. Bases include, but are not limited to, alkali metal hydroxides (e.g., LiOH, KOH, RbOH, CsOH), alkaline earth metal hydroxides (e.g., $Be(OH)_2$, $Mg(OH)_2$, $Ca(OH)_2$, $Sr(OH)_2$, $Ba(OH)_2$), ammonium hydroxide (i.e., ammonia), and a tetraalkylammonium hydroxide compound having the formula $NR^1R^2R^3R^4OH$, wherein $R^1$, $R^2$, $R^3$ and $R^4$ may be the same as or different from one another and are selected from the group consisting of hydrogen, straight-chain or branched $C_1$-$C_6$ alkyl (e.g., methyl, ethyl, propyl, butyl, pentyl, and hexyl) groups, $C_1$-$C_6$ hydroxyalkyl (e.g., hydroxymethyl, hydroxyethyl, hydroxypropyl, hydroxybutyl, hydroxypentyl, and hydroxyhexyl) groups, and substituted or unsubstituted $C_6$-$C_{10}$ aryl groups (e.g., benzyl groups). Tetraalkylammonium hydroxides that are commercially available include tetramethylammonium hydroxide (TMAH), tetraethylammonium hydroxide (TEAH), tetrapropylammonium hydroxide (TPAH), tetrabutylammonium hydroxide (TBAH), tributylmethylammonium hydroxide (TBMAH), benzyltrimethylammonium hydroxide (BTMAH), choline hydroxide, ethyltrimethylammonium hydroxide, tris(2-hydroxyethyl)methyl ammonium hydroxide, diethyldimethylammonium hydroxide, and combinations thereof, may be used. Alternatively or in addition, the pH adjusting agent may be a quaternary base having the formula $(PR^1R^2R^3R^4)$ OH, wherein $R^1$, $R^2$, $R^3$, and $R^4$ may be the same as or different from one another and are selected from the group consisting of hydrogen, straight-chain $C_1$-$C_6$ alkyl (e.g., methyl, ethyl, propyl, butyl, pentyl, and hexyl) groups, branched $C_1$-$C_6$ alkyl groups, $C_1$-$C_6$ hydroxyalkyl (e.g., hydroxymethyl, hydroxyethyl, hydroxypropyl, hydroxybutyl, hydroxypentyl, and hydroxyhexyl) groups, substituted $C_6$-$C_{10}$ aryl groups, unsubstituted $C_6$-$C_{10}$ aryl groups (e.g., benzyl groups), and any combination thereof, such as tetrabutylphosphonium hydroxide (TBPH), tetramethylphosphonium hydroxide, tetraethylphosphonium hydroxide, tetrapropylphosphonium hydroxide, benzyltriphenylphosphonium hydroxide, methyl triphenylphosphonium hydroxide, ethyl triphenylphosphonium hydroxide, N-propyl triphenylphosphonium hydroxide. Acids include, but are not limited to, nitric acid, sulfuric acid, phosphoric acid, hydrochloric acid, hydrobromic acid, methanesulfonic acid, benzenesulfonic acid, p-toluenesulfonic acid, trifluoromethanesulfonic acid, acetic acid, lactic acid, glycolic acid, and any combination thereof. In one embodiment, the pH adjusting agent comprises KOH. In another embodiment, the pH adjusting agent comprises choline hydroxide. In yet another embodiment, the pH adjusting agent comprises ammonium hydroxide. In another embodiment, the pH adjusting agent comprises at least one alkali metal hydroxide and at least one additional hydroxide enumerated herein. In another embodiment, the pH adjusting agent comprises KOH and at least one additional hydroxide enumerated herein. In still another embodiment, the pH adjusting agent comprises KOH and at least one of choline hydroxide and ammonium hydroxide. To any of these enumerated embodiments, the pH adjusting agent can further include at least one acid, for example, sulfuric acid, citric acid, or a combination of citric acid and sulfuric acid.

Organic additives contemplated include, but are not limited to, 2-pyrrolidinone, 1-(2-hydroxyethyl)-2-pyrrolidinone (HEP), glycerol, 1,4-butanediol, tetramethylene sulfone (sulfolane), dimethyl sulfone, ethylene glycol, propylene glycol, dipropylene glycol, tetraglyme, diglyme, methyl isobutyl ketone, methyl ethyl ketone, acetone, isopropanol, octanol, ethanol, butanol, methanol, isophorone, a glycol ether (e.g., diethylene glycol monomethyl ether, triethylene glycol monomethyl ether, diethylene glycol monoethyl ether, triethylene glycol monoethyl ether, ethylene glycol monopropyl ether, ethylene glycol monobutyl ether, diethylene glycol monobutyl ether (DEGBE), triethylene glycol monobutyl ether (TEGBE), ethylene glycol monohexyl ether (EGHE), diethylene glycol monohexyl ether (DEGHE), ethylene glycol phenyl ether, diethylene glycol phenylether, propylene glycol methyl ether, dipropylene glycol methyl ether (DPGME), tripropylene glycol methyl ether (TPGME), dipropylene glycol dimethyl ether, dipropylene glycol ethyl ether, propylene glycol n-propyl ether, dipropylene glycol n-propyl ether (DPGPE), tripropylene glycol n-propyl ether, propylene glycol n-butyl ether (such as DOWANOL PnB), dipropylene glycol n-butyl ether, tripropylene glycol n-butyl ether, dipropylene glycol phenyl ether, propylene glycol phenyl ether (PPh, such as DOWANOL PPh), 4-methyl-2-pentanone, 2,4-dimethyl-3-pentanone, cyclohexanone, 5-methyl-3-heptanone, 3-pentanone, 5-hydroxy-2-pentanone, 2,5-hexanedione, 4-hydroxy-4-methyl-2-pentanone, acetone, butanone, 2-methyl-2-butanone, 3,3-dimethyl-2-butanone, 4-hydroxy-2-butanone, cyclopentanone, 2-pentanone, 3-pentanone, 1-phenylethanone, acetophenone, benzophenone, 2-hexanone, 3-hexanone, 2-heptanone, 3-heptanone, 4-heptanone, 2,6-dimethyl-4-heptanone, 2-octanone, 3-octanone, 4-octanone, dicyclohexyl ketone, 2,6-dimethylcyclohexanone, 2-acetylcyclohexanone, 2,4-pentanedione, menthone, monoethanolamine (MEA) and combinations thereof. In a preferred embodiment, the at least one organic additive in the removal composition comprises at least one glycol ether comprising propylene glycol phenyl ether.

Polymers, when present, include, but are not limited to, methacrylic acid homopolymer and copolymers with, for example, acrylamidomethylpropane sulfonic acid and maleic acid; maleic acid/vinyl ether copolymer; poly(vinylpyrrolidone)/vinyl acetate; homopolymers such as phosphonated polyethyleneglycol oligomers, poly(acrylic acid) (PAA), poly(acrylamide), poly(vinyl acetate), poly(ethylene glycol) (PEG), polypropylene glycol) (PPG), poly(styrene sulfonic acid), poly(vinyl sulfonic acid), poly(vinyl phosphonic acid), poly(vinyl phosphoric acid), poly(ethyleneimine), poly(propyleneimine), polyallylamine, polyethylene oxide (PEO), polyvinyl pyrrolidone (PVP); PPG-PEG-PPG block copolymers; PEG-PPG-PEG block copolymers; and combinations thereof. When present, the amount of polymer(s) in the removal composition is in a range from about 0.0001 wt % to about 1 wt %, based on the total weight of the removal composition.

Oxygen scavengers, when present, include, but are not limited to, dialkylhydroxylamines, hydroxyalkylhydroxylamines, carbohydrazide, 2-aminoethylpiperazine (AEP), methylethylketoxime, hydroquinone, hydrazines, 1,3-, 1,4- and 2,5-cyclohexanediones alone or in combination with 3-methoxypropylamine, aminophenols, linear water-soluble polyethyleneamines (e.g., triethylenetetramine, tetraethylenepentamine, pentaethylenehexamines), sodium sulfite, ammonium sulfite, potassium sulfite, and combinations thereof. Preferably, the oxygen scavenger includes carbohydrazide, 2-aminoethylpiperazine (AEP), methylethylketoxime, hydroquinone, hydrazines, 1,3-, 1,4- and 2,5-cyclohexanediones alone or in combination with 3-methoxypropylamine, aminophenols, linear water-soluble polyethyleneamines such as triethylenetetramine, tetraethylenepentamine, pentaethylenehexamines, and combinations thereof. Without being bound by theory, it is thought that the oxygen scavengers assist with the stabilization of the reducing agent. When present, the amount of oxygen scavenger(s) in the removal composition is in a range from about 0.0001 wt % to about 1 wt %, based on the total weight of the removal composition.

Reducing agents include, but are not limited to, ascorbic acid, L(+)-ascorbic acid, isoascorbic acid, ascorbic acid derivatives, sulfurous acid, ammonium sulfite, potassium sulfite, sodium sulfite, dopamine HCl, phosphorous acid, phosphinic acid, potassium metabisulfite, sodium metabisulfite, ammonium metabisulfite, hydroxylamine, reducing sugars (e.g., galactose, ribose, arabinose, xylose, fucose, rhamnose, mannose, fructose, sorbose, galacturonic acid, glucosamine, maltose, lactose), potassium pyruvate, sodium pyruvate, ammonium pyruvate, formic acid, sodium formate, potassium formate, ammonium formate, dopamine, sulfur dioxide solution, and any combination thereof. Preferably, the at least one reducing agent comprises at least one sulfite ion and at least one other enumerated reducing agent, for example, sulfurous acid, potassium sulfite, ammonium sulfite, phosphinic acid, and any combination thereof. It is to be appreciated that when ammonium sulfite is present, the ammonium sulfite can be produced in situ, wherein the combination of specific components results in the formation of ammonium sulfite to assist with the removal of residue, e.g., ceria particles and other post-CMP residue.

An aqueous removal composition, including the components described above, is particularly useful for removing ceria particles and contaminants (e.g., post-CMP residue and contaminants) from a microelectronic device structure. The pH of the aqueous removal compositions described herein can be in a range from about 1 to about 13.9. In one embodiment, the pH is in a range from about 3 to about 13.9, preferably about 3.5 to about 13.9. In another embodiment, the pH is in a range from about 3.5 to about 5.5. In still another embodiment, the pH is in a range from about 4.5 to about 8.5, preferably about 7.5 to 8.5. In another embodiment, the pH is in a range from about 9 to about 13.7.

In a particularly preferred embodiment, the aqueous removal composition comprises, consists of, or consists essentially of reducing agent(s), at least one pH adjusting agent, at least one organic additive, and water. In still another embodiment, the aqueous removal composition comprises, consists of, or consists essentially of a compound comprising a sulfite ion, at least one pH adjusting agent, at least one organic additive, and water. In still another embodiment, the aqueous removal composition comprises, consists of, or consists essentially of reducing agent(s), at least one pH adjusting agent, propylene glycol phenyl ether, and water. In yet another embodiment, the aqueous removal composition comprises, consists of, or consists essentially of a compound comprising a sulfite ion, at least one pH adjusting agent, propylene glycol phenyl ether, and water. In another embodiment, the aqueous removal composition comprises, consists of, or consists essentially of reducing agent(s), at least one complexing agent, at least one pH adjusting agent, at least one organic additive, and water. In another embodiment, the aqueous removal composition comprises, consists of, or consists essentially of a compound comprising a sulfite ion, at least one complexing agent, at least one pH adjusting agent, at least one organic additive, and water. In still another embodiment, the aqueous removal composition comprises, consists of, or consists essentially of a compound comprising a sulfite ion, citric acid, at least one pH adjusting agent, at least one organic additive, and water. In yet another embodiment, the aqueous removal composition comprises, consists of, or consists essentially of a compound comprising a sulfite ion, citric acid, at least one pH adjusting agent, propylene glycol phenyl ether, and water. In another embodiment, the aqueous removal composition comprises, consists of, or consists essentially of reducing agent(s) (e.g., a compound comprising a sulfite ion), at least one pH adjusting agent, at least one organic additive, at least one oxygen scavenger, and water. In still another embodiment, the aqueous removal composition comprises, consists of, or consists essentially of reducing agent(s) (e.g., a compound comprising a sulfite ion), at least one pH adjusting agent, at least one organic additive, at least one complexing agent (e.g., citric acid), at least one oxygen scavenger, and water.

With regards to compositional amounts, the weight percent ratios of organic additive(s) to reducing agent(s) is in a range from about 0.001:1 to about 10:1, preferably about 0.1:1 to about 5:1. The amount of the pH adjusting agent is dependent on the final pH sought when preparing the removal composition for use, based on the pH values disclosed herein, and the knowledge of the person skilled in the art.

The range of weight percent ratios of the components will cover all possible concentrated or diluted embodiments of the composition. Towards that end, in one embodiment, a concentrated removal composition is provided that can be diluted for use as a cleaning solution. A concentrated composition, or "concentrate," advantageously permits a user (e.g. a CMP process engineer) to dilute the concentrate to the desired strength and pH at the point of use. Dilution of the concentrated aqueous removal composition may be in a range from about 1:1 to about 2500:1, preferably about 5:1 to about 200:1, and most preferably about 20:1 to about 120:1, wherein the aqueous removal composition is diluted at or just before the tool with solvent, e.g., deionized water. It is to be appreciated by one skilled in the art that following dilution, the range of weight percent ratios of the components disclosed herein should remain unchanged.

The compositions described herein may have utility in applications including, but not limited to, post-etch residue removal, post-ash residue removal surface preparation, post-plating cleaning and post-CMP residue removal. In addition, it is contemplated that the aqueous cleaning compositions described herein may be useful for the cleaning and protection of other metal (e.g., copper-containing and tungsten-containing) products including, but not limited to, decorative metals, metal wire bonding, printed circuit boards and other electronic packaging using metal or metal alloys.

In yet another preferred embodiment, the aqueous removal compositions described herein further includes ceria particles and/or CMP contaminants. The ceria particles and contaminants become a component of the removal composition after cleaning has begun and will be dissolved and/or suspended in the compositions.

The aqueous removal compositions are easily formulated by simple addition of the respective ingredients and mixing to homogeneous condition. Furthermore, the compositions may be readily formulated as single-package formulations or multi-part formulations that are mixed at or before the point of use, e.g., the individual parts of the multi-part formulation may be mixed at the tool or in a storage tank upstream of the tool. The concentrations of the respective ingredients may be widely varied in specific multiples of the composition, i.e., more dilute or more concentrated, and it will be appreciated that the compositions described herein can variously and alternatively comprise, consist or consist essentially of any combination of ingredients consistent with the disclosure herein.

Accordingly, another aspect relates to a kit including, in one or more containers, one or more components adapted to form the compositions described herein. The kit may include, in one or more containers, at least one pH adjusting agent, at least one reducing agent, at least one organic additive, water, optionally at least one complexing agent, optionally at least one polymer, and optionally at least one oxygen scavenger, for combining with additional solvent (e.g., water) at the fab or the point of use. Alternatively, the kit may include, in one or more containers, at least one reducing agent, at least one organic additive, water, optionally at least one complexing agent, optionally at least one polymer, and optionally at least one oxygen scavenger, for combining with at least one pH adjusting agent and additional solvent (e.g., water) at the fab or the point of use. The containers of the kit must be suitable for storing and shipping the compositions and may be, for example, NOWPak® containers (Entegris, Inc., Billerica, Mass., USA).

The one or more containers which contain the components of the aqueous removal composition preferably include means for bringing the components in said one or more containers in fluid communication for blending and dispense. For example, referring to the NOWPak® containers, gas pressure may be applied to the outside of a liner in said one or more containers to cause at least a portion of the contents of the liner to be discharged and hence enable fluid communication for blending and dispense. Alternatively, gas pressure may be applied to the head space of a conventional pressurizable container or a pump may be used to enable fluid communication. In addition, the system preferably includes a dispensing port for dispensing the blended removal composition to a process tool.

As applied to microelectronic manufacturing operations, the aqueous removal compositions described herein are usefully employed to clean ceria particles and/or CMP contaminants (e.g., post-CMP residue and contaminants) from the surface of the microelectronic device. The aqueous removal compositions do not damage low-k dielectric materials (e.g., silicon oxide), silicon nitride layers, or tungsten-containing layers on the device surface. Preferably the aqueous removal compositions remove at least 85% of the ceria particles present on the device prior to particle removal, more preferably at least 90%, even more preferably at least 95%, and most preferably at least 99%.

In post-CMP particle and contaminant removal applications, the aqueous removal composition described herein may be used with a large variety of conventional cleaning tools such as megasonics and brush scrubbing, including, but not limited to, Verteq single wafer megasonic Goldfinger, OnTrak systems DDS (double-sided scrubbers), SEZ or other single wafer spray rinse, Applied Materials Mirra-Mesa™/Reflexion™/Reflexion LK™, and Megasonic batch wet bench systems.

In use of the compositions described herein for removing ceria particles and CMP contaminants from microelectronic devices having same thereon, the aqueous removal composition typically is contacted with the device for a time of from about 5 sec to about 10 minutes, preferably about 1 sec to 20 min, preferably about 15 sec to about 5 min at temperature in a range of from about 20° C. to about 90° C., preferably about 20° C. to about 50° C. Such contacting times and temperatures are illustrative, and any other suitable time and temperature conditions may be employed that are efficacious to at least partially remove the ceria particles and CMP contaminants from the device, within the broad practice of the method. "At least partially clean" and "substantial removal" both correspond to at removal of at least 85% of the ceria particles present on the device prior to particle removal, more preferably at least 90%, even more preferably at least 95%, and most preferred at least 99%.

Following the achievement of the desired particle removal action, the aqueous removal composition may be readily removed from the device to which it has previously been applied, as may be desired and efficacious in a given end use application of the compositions described herein. Preferably, the rinse solution includes deionized water. Thereafter, the device may be dried using nitrogen or a spin-dry cycle.

Yet another aspect relates to the improved microelectronic devices made according to the methods described herein and to products containing such microelectronic devices.

Another aspect relates to a recycled aqueous removal composition, wherein the removal composition may be recycled until particle and/or contaminant loading reaches the maximum amount the aqueous removal composition may accommodate, as readily determined by one skilled in the art.

A still further aspect relates to methods of manufacturing an article comprising a microelectronic device, said method comprising contacting the microelectronic device with an aqueous removal composition for sufficient time to remove ceria particles and CMP contaminants from the microelectronic device having said particles and contaminants thereon, and incorporating said microelectronic device into said article, using a removal composition described herein.

In another aspect, a method of removing ceria particles and CMP contaminants from a microelectronic device having same thereon is described. The method comprises polishing the microelectronic device with a CMP slurry, wherein the CMP slurry comprises ceria particles; contacting the microelectronic device with an aqueous removal composition comprising at least one pH adjusting agent, at least one reducing agent, at least one organic additive, water, optionally at least one complexing agent, optionally at least one polymer, and optionally at least one oxygen scavenger, for a sufficient time to remove ceria particles and CMP contaminants from the microelectronic device to form a post-CMP particle-containing composition; and continuously contacting the microelectronic device with the post-CMP particle-containing composition for a sufficient amount of time to effect substantial cleaning of the microelectronic device. Any of the components described above may be used in the present method of removing ceria particles and CMP contaminants.

Another aspect relates to an article of manufacture comprising an aqueous removal composition, a microelectronic device wafer, and material selected from the group consisting of ceria particles, CMP contaminants and combinations thereof, wherein the removal composition comprises at least one pH adjusting agent, at least one reducing agent, at least one organic additive, water, optionally at least one complexing agent, optionally at least one polymer, and optionally at least one oxygen scavenger.

The features and advantages of the invention are more fully illustrated by the following non-limiting examples, wherein all parts and percentages are by weight, unless otherwise expressly stated.

Example 1

The removal compositions shown below were prepared (the balance in each formulation was DI water) and diluted 100:1 with water. The process involved immersing a TEOS substrate in a ceria-containing slurry for 5 minutes, rinsing the substrate in DI water for 30 seconds, immersing the substrate in the removal composition for 60 seconds, and then rinsing with a second DI water rinse for 30 seconds. The temperature during immersion was room temperature. The extent of cleaning was determined using Scanning Electron Microscopy (SEM), Inductively Coupled Plasma Mass Spectrometry (ICP-MS), and Dark Field Microscopy (DFM), and compared to Comparative Formulation 1.
Formulation A: 2 wt % citric acid, 2 wt % propylene glycol phenyl ether, balance water. pH after adjustment and 1:100 dilution=2.5
Formulation B: 2 wt % citric acid, 2 wt % sodium sulfite, balance water. pH after adjustment and 1:100 dilution=2.6
Formulation C: 2 wt % citric acid, 2 wt % propylene glycol phenyl ether, 2 wt % sodium sulfite, balance water. pH after adjustment and 1:100 dilution=2.6
Comparative Formulation 1: $NH_4OH:H_2O_2:H_2O=1:1:5$ DFM data indicates the total area of ceria contamination after cleaning. Formulations A-C were all found to be more efficient at cleaning than Comparative Formulation 1. In particular, Formulation C was found to be 3.5× more efficient the comparative formulation and 2× more efficient than Formulation A.

Based on the effectiveness of Formulation C, additional compositions were prepared and the DFM data determined, as shown in Table 1. The balance in each formulation was DI water. KOH was added to adjust pH to the target pH. The formulations were diluted 100:1 with water and a TEOS substrate comprising ceria-containing slurry was immersed therein for 5 minutes at room temperature.

TABLE 1

Formulations and DFM data

| Formulation | citric acid(wt %) | $(NH_4)_2SO_3$ (wt %) | Dowanol PPh (wt %) | target pH (after 1:100 dilution) | DFM total area |
|---|---|---|---|---|---|
| D | 2 | 4 | 1 | 6 | 4541 |
| E | 2 | 0 | 0 | 2 | 65963 |
| F | 2 | 2 | 0.5 | 4 | 5883 |
| G | 2 | 2 | 0.5 | 3 | 43635 |
| H | 2 | 0 | 0 | 6 | 4186 |
| I | 2 | 0 | 1 | 6 | 4367 |
| J | 2 | 2 | 0.75 | 4 | 2286 |
| K | 2 | 4 | 0 | 2 | 123542 |
| L | 2 | 0 | 1 | 2 | 120142 |
| M | 2 | 4 | 1 | 2 | 121806 |
| N | 2 | 2 | 0.5 | 5 | 2368 |
| O | 2 | 2 | 0.25 | 4 | 4537 |
| P | 2 | 4 | 0 | 6 | 6340 |
| Q | 2 | 3 | 0.5 | 4 | 8381 |
| R | 2 | 1 | 0.5 | 4 | 9414 |

It was found that Formulation J had 150× improved performance relative to Comparative Formulation 1. Formulations D, F, H, I, and N-R were also more efficient than the comparative formulation at cleaning. Of note, these formulations had a higher pH, in a range from 4-6.

Example 2

The removal compositions shown below were prepared (the balance in each formulation was DI water) and diluted 100:1 with water. The process involved immersing a TEOS substrate in a ceria-containing slurry for 5 minutes, rinsing the substrate in DI water for 30 seconds, immersing the substrate in the removal composition for 60 seconds, and then rinsing with a second DI water rinse for 30 seconds. The temperature during immersion was room temperature. The extent of cleaning was determined using Scanning Electron Microscopy (SEM), Inductively Coupled Plasma Mass Spectrometry (ICP-MS), and Dark Field Microscopy (DFM). In particular, Table 2 shows DMF data for each removal composition.

TABLE 2

Formulations and DFM data

| Formulation | organic additive/wt % | Reducing agent/wt % | other/wt % | pH (before dilution) | DFM total area |
|---|---|---|---|---|---|
| A1 | | 2% ascorbic acid | 0.05% PAA | 2.14 | 287340 |
| A2 | 4.5% MEA | 3.7% ascorbic acid | 0.05% PAA | 13.1 | 27458 |
| A3 | | 2% ascorbic acid | | 0.60 | 188947 |
| A4 | | 4% hydroxylamine (50%) | | 0.99 | 155878 |
| A5 | | 4% hydroxylamine (50%) | | 1.01 | 125438 |
| A6 | | 4% hydroxylamine (50%), 2% formic acid | | 1.00 | 120243 |
| A7 | | 1.3% $SO_3^{2-}$ | | 0.95 | 194531 |
| A8 | 0.5% PPh | | | 0.61 | 219647 |
| A9 | | 2% dopamine HCl | | 0.51 | 346860 |
| A10 | | | | | 361493 |
| A11 | 2% PPh | 1.4% $SO_3^{2-}$ | | 1.56 | 114210 |
| A12 | 0.75% PPh | 1.4% $SO_3^{2-}$ | | 4 | 2286 |
| A13 | 2% PPh | 47% $H_2SO_3$ (6%) | | 1.0 | 293491 |
| A14 | 2% PPh | 4% hydroxylamine (50%) | | | 424070 |
| A15 | 2% PPh | 2% hydroxylamine (50%) | | 1.0 | 409511 |

TABLE 2-continued

Formulations and DFM data

| Formulation | organic additive/wt % | Reducing agent/wt % | other/wt % | pH (before dilution) | DFM total area |
|---|---|---|---|---|---|
| A16 | 2% PPh | 3% cysteine | | 1.0 | 322447 |
| A17 | 2% PPh | 2% dopamine HCl | | | 344577 |
| A18 | 0.5% PPh | 0.3% $SO_3^{2-}$ | | 4.6 | 4971 |
| A19 | 0.5% PPh | 0.3% $SO_3^{2-}$ | 0.55% TEA | 4.6 | 11428 |
| A20 | 0.5% PPh | 0.6% $SO_3^{2-}$ | | 4.6 | 14016 |
| A21 | 0.5% PPh | 0.3% $SO_3^{2-}$ | | 8.0 | 3435 |
| A22 | 0.5% PPh | 0.3% $SO_3^{2-}$ + 0.2% formic acid | | 8.0 | 6272 |
| A23 | 0.5% PPh | 1.3% $SO_3^{2-}$ | | 4.5 | 24029 |
| A24 | 0.5% PPh | 0.25% $SO_3^{2-}$ | | 4.5 | 7284 |
| A25 | 0.5% PPh | 0.3% $SO_3^{2-}$ | | 4.5 | 70316 |
| A26 | 0.5% PPh | 0.3% $SO_3^{2-}$ | 0.1% diethyl hydroxyl amine | 4.6 | 13135 |
| A27 | 0.5% PPh | 0.3% $SO_3^{2-}$ | 0.1% methyl isobutyl ketone | 4.6 | 2779 |
| A28 | 0.5% PPh | 0.3% $SO_3^{2-}$ | 0.1% carbohydrazide | 4.6 | 4967 |
| A29 | 0.5% PPh | 0.3% $SO_3^{2-}$ | 2% citric acid + 0.1% AEP | 4.6 | 15608 |
| A30 | 0.5% PPh | 2% dopamine HCl | 2% citric acid | 4.6 | 11488 |
| A31 | 0.5% PPh | 4% phosphinic acid (50%) | 2% citric acid | 4.6 | 1522 |
| A32 | 0.5% PPh | 2% MEA | 2% citric acid | 4.6 | 4710 |
| A33 | 0.5% PPh | 2% potassium metabisulfite | 2% citric acid | 4.6 | 3540 |
| A34 | 0.5% PPh | 4% hydroxylamine (50%) | 2% citric acid | 4.6 | 7351 |
| A35 | 0.5% PPh | 2% ascorbic acid | 2% citric acid | 4.6 | 5581 |
| A36 | 0.5% PPh | 2% tiron | 2% citric acid | 4.6 | 4062 |
| A37 | 0.5% PPh | 0.3% $SO_3^{2-}$ | 2% citric acid | 10 | 7497 |
| A38 | 0.5% PPh | 0.3% $SO_3^{2-}$ | 2% citric acid | 12 | 5985 |
| A39 | 0.5% PPh | 0.3% $SO_3^{2-}$ | 2% citric acid | 13.7 | 7324 |

Although the invention has been variously disclosed herein with reference to illustrative embodiments and features, it will be appreciated that the embodiments and features described hereinabove are not intended to limit the invention, and that other variations, modifications and other embodiments will suggest themselves to those of ordinary skill in the art, based on the disclosure herein. The invention therefore is to be broadly construed, as encompassing all such variations, modifications and alternative embodiments within the spirit and scope of the claims hereafter set forth.

What is claimed is:

1. An aqueous removal composition used on a surface consisting of at least one pH adjusting agent, at least one reducing agent, at least one organic additive, water, optionally at least one complexing agent for complexing a metal atom or metal ion, optionally at least one polymer, and optionally at least one oxygen scavenger,
    wherein the aqueous removal composition consists of less than 0.001 wt % surfactant and is suitable for removing at least ninety percent of ceria particles from the surface and chemical mechanical polishing (CMP) contaminants from a microelectronic device having said particles and CMP contaminants thereon,
    wherein the at least one organic additive and the at least one reducing agent are present in a weight percent ratio in a range of from about 0.001:1 to about 10:1 and
    wherein the at least one organic additive is 2-pyrrolidinone, 1-(2-hydroxyethyl)-2-pyrrolidinone (HEP), tetraglyme, diglyme, methyl isobutyl ketone, methyl ethyl ketone, acetone, isopropanol, octanol, ethanol, butanol, methanol, isophorone, diethylene glycol monomethyl ether, triethylene glycol monomethyl ether, diethylene glycol monoethyl ether, triethylene glycol monoethyl ether, ethylene glycol monopropyl ether, ethylene glycol monobutyl ether, diethylene glycol monobutyl ether (DEGBE), triethylene glycol monobutyl ether (TEGBE), ethylene glycol monohexyl ether (EGHE), diethylene glycol monohexyl ether (DEGHE), ethylene glycol phenyl ether, diethylene glycol phenylether, 4-methyl-2-pentanone, 2,4-dimethyl-3-pentanone, cyclohexanone, 5-methyl-3-heptanone, 3-pentanone, 5-hydroxy-2-pentanone, 2,5-hexanedione, 4-hydroxy-4-methyl-2-pentanone, acetone, butanone, 2-methyl-2-butanone, 3,3-dimethyl-2-butanone, 4-hydroxy-2-butanone, cyclopentanone, 2-pentanone, 3-pentanone, 1-phenylethanone, acetophenone, benzophenone, 2-hexanone, 3-hexanone, 2-heptanone, 3-heptanone, 4-heptanone, 2,6-dimethyl-4-heptanone, 2-octanone, 3-octanone, 4-octanone, dicyclohexyl ketone, 2,6-dimethylcyclohexanone, 2-acetylcyclohexanone, 2,4-pentanedione, menthone, or combinations thereof.

2. The aqueous removal composition of claim 1, wherein the at least one pH adjusting agent is an alkali metal hydroxide, ammonium hydroxide, choline hydroxide, or a tetraalkylammonium hydroxide.

3. The aqueous removal composition of claim 1, wherein the at least one pH adjusting agent is sulfuric acid, citric acid, or combinations thereof.

4. The aqueous removal composition of claim 1, wherein the at least one reducing agent is sulfurous acid, potassium sulfite, ammonium sulfite, phosphinic acid, or combinations thereof.

5. The aqueous removal composition of claim 1, wherein the at least one oxygen scavenger is carbohydrazide, 2-aminoethylpiperazine (AEP), methylethylketoxime, hydroquinone, hydrazines, or 1,3-, 1,4- or 2,5-cyclohexanediones.

6. The aqueous removal composition of claim 1, wherein the at least one complexing agent is an alkanolamine.

7. The aqueous removal composition of claim 1, wherein the at least one polymer is poly(methacrylic acid) or poly(acrylic acid).

8. The aqueous removal composition of claim 1, wherein the microelectronic device comprises a silicon nitride and low-k dielectric layers.

9. The aqueous removal composition of claim 1, wherein the aqueous removal composition is substantially devoid of at least one of oxidizing agents, fluoride-containing sources, tetramethylammonium hydroxide, chemical mechanical polishing abrasive materials and corrosion inhibitors selected from the group consisting of cyanuric acid, barbituric acid and derivatives thereof, glucuronic acid, squaric acid, alpha-keto acids, adenosine and derivatives thereof, ribosylpurines and derivatives thereof, purine compounds and derivatives thereof, degradation products of adenosine and adenosine derivatives, triaminopyrimidine, purine-saccharide complexes, phosphonic acid and derivatives thereof, phenanthroline, glycine, nicotinamide and derivatives thereof, flavonoids and derivatives thereof, quercitin and derivatives thereof, and combinations thereof.

10. The aqueous removal composition of claim 1, wherein the aqueous removal composition is free of surfactants.

11. The aqueous removal composition of claim 1, wherein the composition has a pH of from about 3.5 to about 5.5.

12. The aqueous removal composition of claim 1, wherein the composition has a pH of from 4 to 6.

\* \* \* \* \*